(12) United States Patent
Ghildiyal

(10) Patent No.: US 6,501,395 B1
(45) Date of Patent: Dec. 31, 2002

(54) SYSTEM, METHOD AND COMPUTER READABLE MEDIUM FOR COMPRESSING A DATA SEQUENCE

(75) Inventor: Ramkrishna Ghildiyal, Haryana (IN)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 10/120,026

(22) Filed: Apr. 10, 2002

(51) Int. Cl.[7] .............................................. H03M 7/34
(52) U.S. Cl. .......................................... 341/51; 341/50
(58) Field of Search .............................. 341/50, 51, 67

(56) References Cited

U.S. PATENT DOCUMENTS

| | | | | |
|---|---|---|---|---|
| 4,558,302 A | | 12/1985 | Welch | 341/51 |
| 4,701,745 A | | 10/1987 | Waterworth | 341/63 |
| 4,814,746 A | | 3/1989 | Miller et al. | 341/95 |
| 5,710,719 A | * | 1/1998 | Houle | 364/514 |
| 6,320,522 B1 | * | 11/2001 | Satoh | 341/51 |
| 6,262,675 B1 | * | 7/2002 | Iyer | 341/51 |

\* cited by examiner

Primary Examiner—Peguy JeanPierre

(57) ABSTRACT

A method for compressing an input sequence of data portions is disclosed. The input sequence is compressed using a Lempel-Ziv technique to generate an output codestream. The codestream includes an ordered sequence of codewords corresponding to and separate from a stream of at least one sequence of non-matchable portions in the input sequence. Each codeword includes three data items denoting a length of a non-matchable sequence receding a matchable first sequence, the offset associated therewith and the length of the matchable first sequence. The codewords are used to reference sequences of data portions which previously appeared when decompressing the output codestream to allow the input sequence to be rebuilt. A program storage device and a compressing system for providing the above method are also disclosed.

20 Claims, 3 Drawing Sheets

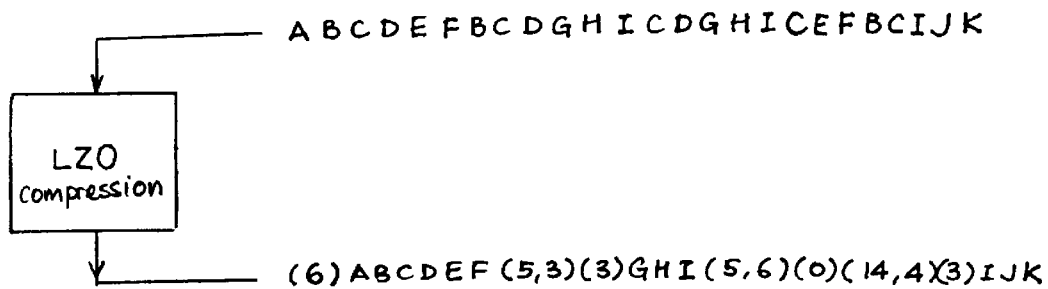
FIG. 1 PRIOR ART
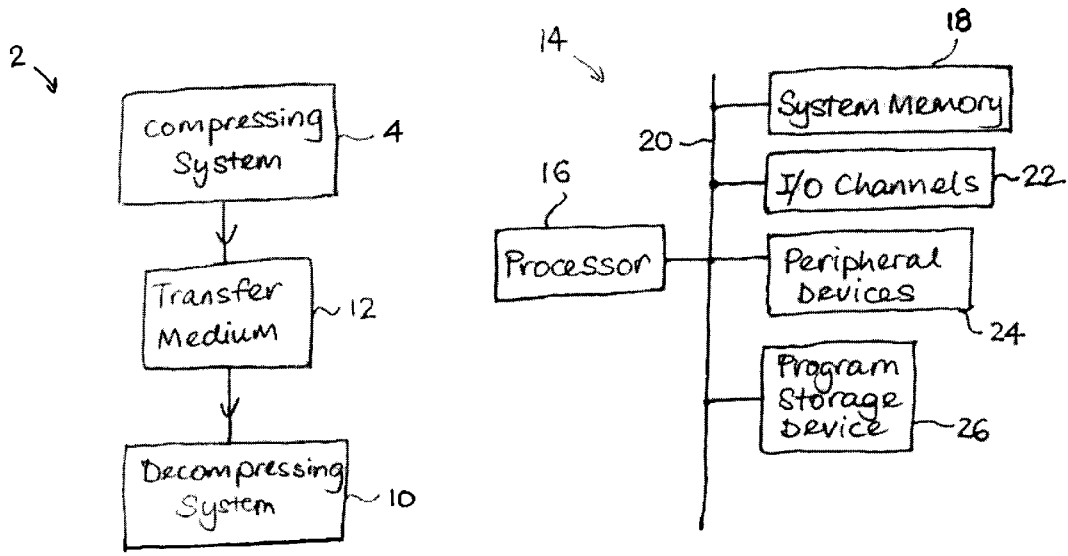
FIG. 2
FIG. 3

SYSTEM, METHOD AND COMPUTER READABLE MEDIUM FOR COMPRESSING A DATA SEQUENCE

BACKGROUND

This invention relates to data compression, and more particularly, to a system and a method for compressing a data sequence using a variant of a Lempel-Ziv technique.

Data compression techniques are used to reduce the amount of data to be stored or transmitted for reducing the storage capacity and transmission time respectively. In either case it is necessary to provide a corresponding decompression technique to enable the original data to be reconstructed.

Many data compression and decompression techniques are known, with the Lempel-Ziv (LZ) technique and its variants proving to be very popular. U.S. Pat. No. 4,558,302, Welch, entitled "High Speed Data Compression and Decompression Apparatus and Method;" U.S. Pat. No. 4,701,745, Waterworth, entitled "Data Compression System;" and U.S. Pat. No. 4,814,746, Miller et al., entitled "Data Compression Method" are patents that disclose some of these LZ techniques. One of the LZ variants is known as the LZ Opperhumer (LZO) technique. FIG. 1 shows an output codestream obtained by compressing an input character sequence using the LZO technique. The output codestream includes codewords interspersed with non-matchable sequences of characters from the input character sequence. The codewords reference sequences of characters which have previously appeared when decompressing the output codestream to allow the original input character sequence to be rebuilt from the codestream.

There is room for improvement in the LZO technique. Because the codewords are interspersed among the non-matchable character sequences, the codewords need to be byte-aligned. If the codewords are of a variable length, delimiters are also required. The need for byte-alignment of the codewords and for the delimiters results in extraneous bits being included in the LZO output codestream. If the codewords are of a fixed length, the delimiters are not necessary. However, such fixed-length codewords can only represent length of character sequences of up to a value representable by data items in the codewords.

SUMMARY

According to an aspect of the present invention, there is provided a method for compressing an input sequence of data portions. The input sequence is sequentially traversed, portion by portion, to determine if a first sequence of portions starting with each portion is matchable with a second sequence of previously traversed portions. If a first sequence is matchable with a second sequence, a length of the first sequence and an offset between the first sequence and the matching second sequence are noted. A stream of at least one non-matchable sequence of data portions in the input sequence is recorded in sequential order. An ordered sequence of codewords separate from the stream is generated. Each codeword includes three data items denoting a length of a non-matchable sequence preceding a matchable first sequence, the offset associated therewith and the length of the matchable first sequence.

According to another aspect of the present invention, there is provided a compressing system having means for compressing an input sequence of data portions as described above.

According to another aspect of the present invention, there is provided a program storage device readable by a computing device, tangibly embodying a program of instructions, executable by the computing device to perform the above method for compressing an input sequence of data portions.

BRIEF DESCRIPTION OF DRAWINGS

The invention will be better understood with reference to the drawings, in which:

FIG. 1 is a schematic drawing showing a character sequence and an output codestream obtained by compressing the character sequence using a prior art Lempel-Ziv-Oberhumer (LZO) technique;

FIG. 2 is a schematic diagram of a data compression/decompression system including a compressing system that compresses a data sequence into a codestream, according to an embodiment of the present invention, for transferring to a decompressing system;

FIG. 3 is a block diagram showing typical hardware elements of a computing system that may be used as the compressing system and decompressing system in FIG. 2;

DETAILED DESCRIPTION

Figure 4:
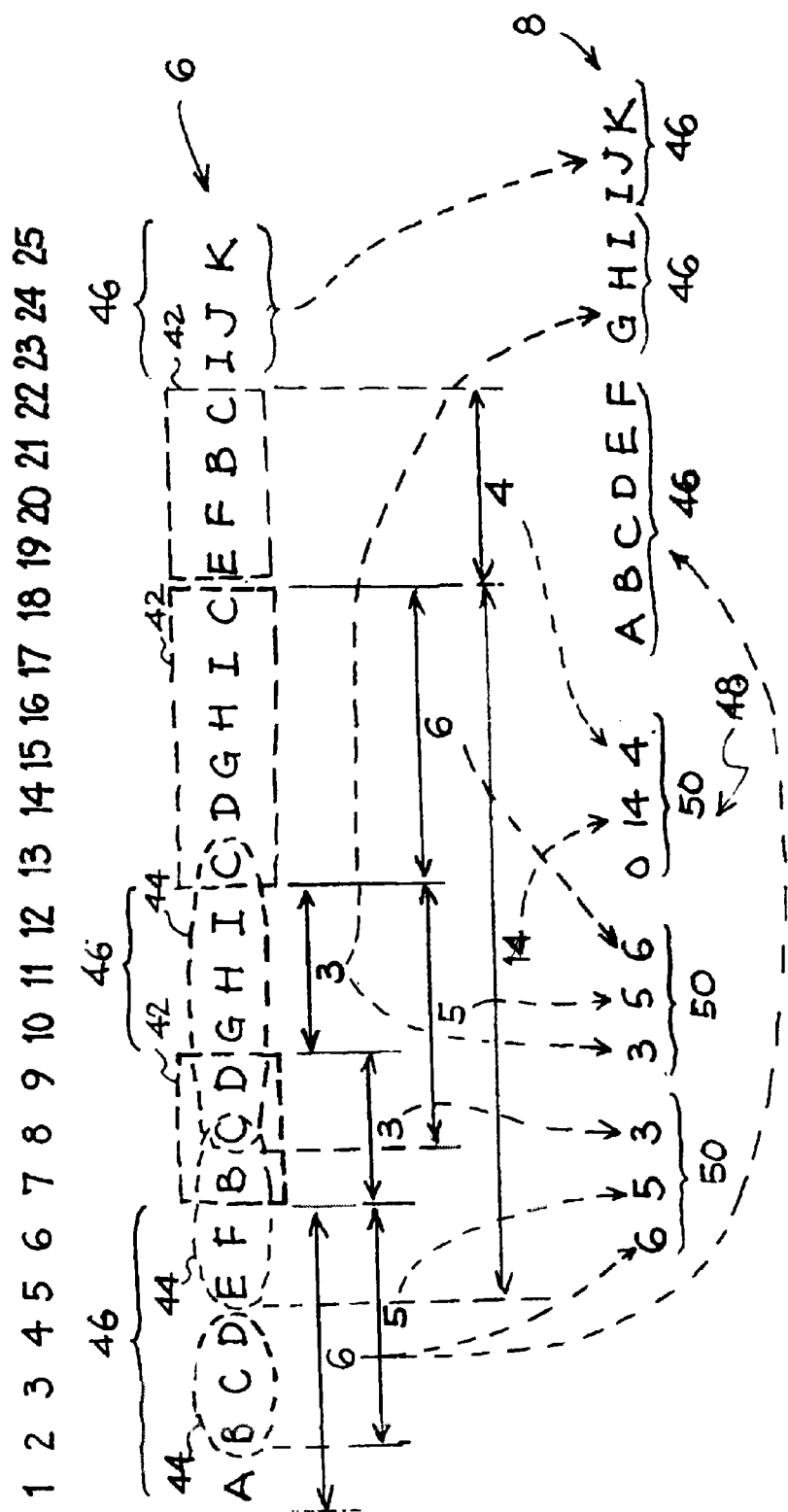
FIG. 4 is a schematic drawing showing an output codestream obtained by compressing the character sequence in FIG. 1 using the compressing system in FIG. 2.

FIG. 2 is a schematic drawing illustrating a data compression/decompression system 2 incorporated with the teachings of the present invention. The system includes a compressing system 4 having means therein that compresses an input sequence of portions of data, such as bytes of data representing a character sequence 6 (FIG. 5), into an output codestream 8 (FIG. 5) for transferring to a decompressing system 10 via a transfer medium 12. The decompressing system 10 receives the codestream 8 and decompresses or expands the codestream 8 to reconstruct the character sequence 6.

FIG. 3 is a block diagram illustrating typical elements of a computing system 14 that may be appropriately programmed to function as the compressing system 4 and the decompressing system 10. The elements include a programmable processor 16 connected to a system memory 18 via a system bus 20. The processor 16 accesses the system memory 18 as well as other input/output (I/O) channels 22 and peripheral devices 24. The computing system 14 further includes at least one program storage device 26, such as a CD-ROM, tape, magnetic media, EPROM, EEPROM, ROM or the like. The computing system stores one or more computer programs that implement a method of compressing a data sequence according to an embodiment of the present invention. The processor 16 reads and executes the one or more computer programs to perform the method. Each of the computer programs may be implemented in any desired computer programming language (including machine, assembly, high level procedural, or object oriented programming languages). In any case, the language may be a compiled or interpreted language.

FIG. 4 shows the output codestream 8 that is obtained by compressing the character sequence 6 using the method. Broadly, the compressing system 4 sequentially traverses the character sequence 6 byte by byte, if each character is stored in a byte, to determine if a first sequence of bytes starting with each traversed byte is matchable with a second sequence of previously traversed bytes. If a first sequence 42 is matchable with a second sequence 44, the compressing system 4 notes a length, in bytes, of the first sequence 42 and an offset, in bytes, between the start of the first and the second sequences 42, 44. The compressing system 4 also records in sequential order any non-matchable sequence 46 of bytes in the character sequence 6. When the character sequence 6 is completely traversed, an ordered sequence 48 of codewords 50 separate from a stream of non-matchable sequences 46 is generated. This ordered sequence 48 of codewords and the stream of non-matchable sequences 46 define compressed data of the character sequence 6. The codewords 50 and the non-matchable sequences 46 are each ordered in the sequence they appear in the character sequence 6. Each codeword 50 includes three data items that denote a length of a non-matchable sequence 46 preceding a matched first sequence 42, the offset between the matched first sequence 42 and a matching second sequence 44, and the length of the matched first sequence 42.

Figure 5:
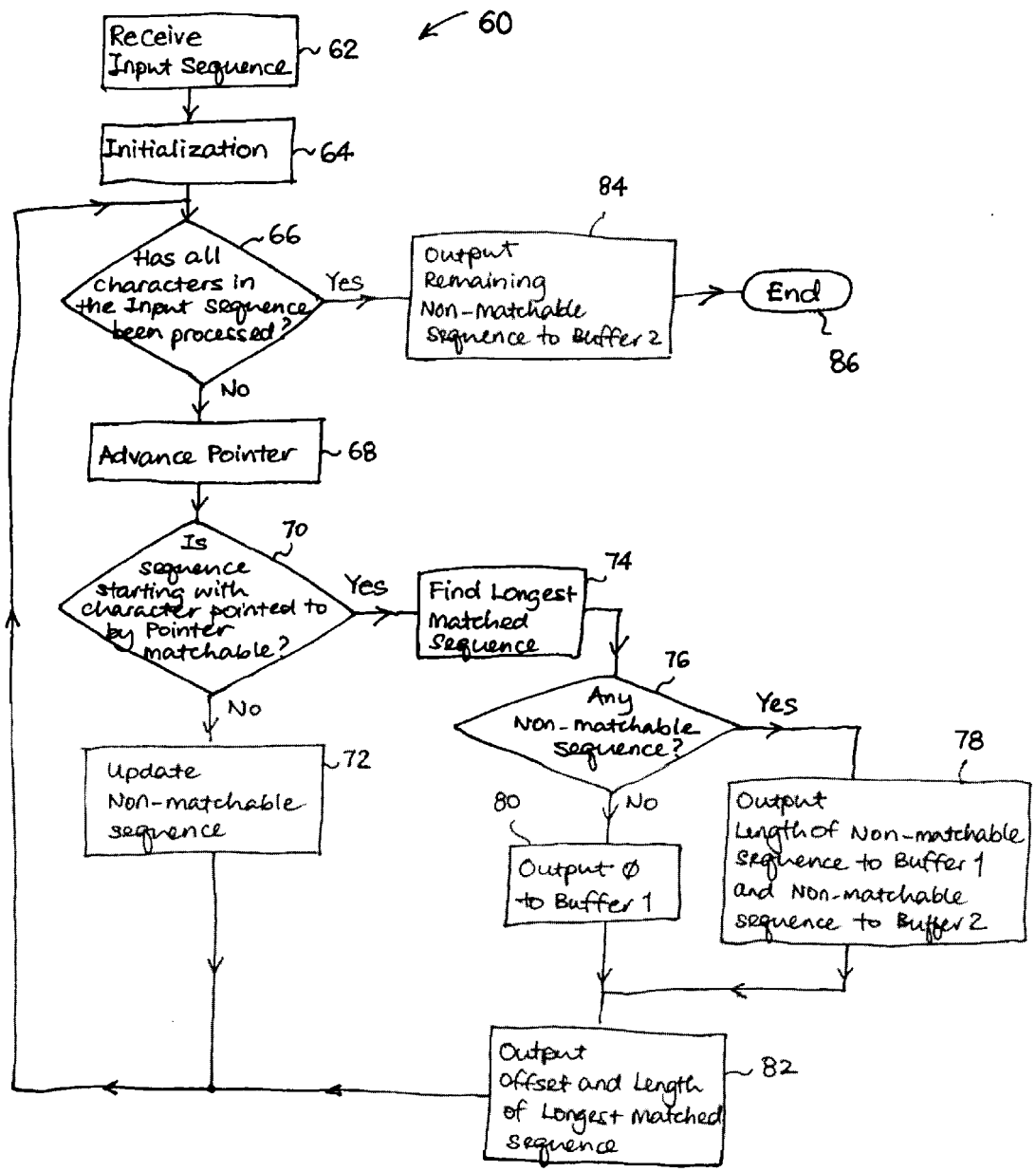
FIG. 5 is a flowchart showing a sequence of steps in the compressing system in FIG. 2 for compressing the character sequence.

FIG. 5 is a flowchart showing a sequence 60 of steps in the method for compressing the character sequence 6 using the compressing system 4. This compression sequence 60 will be described according to a sequence in which it traverses or processes the character sequence 6. The compression sequence 60 starts with a RECEIVE INPUT SEQUENCE step 62, wherein the compressing system 4 receives the character sequence 6. The character sequence 6 in FIG. 4 includes twenty-five characters numbered according to their positions in the character sequence 6. After receiving the character sequence 6 the compression sequence 60 proceeds to an INITIALIZATION step 64, wherein a pointer (not shown) is initialized to point to a character position before the first character "A" in the character sequence 6.

The compression sequence 60 next proceeds to a DETERMINE IF INPUT SEQUENCE IS EXHAUSTED step 66, wherein the compressing system 4 determines if all the characters in the character sequence 6 have been completely processed. If it is determined in this step 66 that there are characters remaining in the character sequence 6 for processing, the compression sequence 60 proceeds to an ADVANCE POINTER step 68. In this step 68, the compressing system 4 advances the pointer by a character position to point to the next character in the character sequence 6. At this point of processing the character sequence 6, the pointer is advanced to point to the character "A" ($1^{st}$ character). The compression sequence 60 next proceeds to a CHECK FOR MATCHING SEQUENCE step 70. In this step 70, the compressing system 4 determines if a first sequence of a predetermined minimum number of characters starting with the character pointed to by the pointer is matchable with a second sequence of previously traversed or processed characters. Matching is performed using a hashing method that has been used in other LZ techniques.

If it is determined according to the CHECK FOR MATCHING SEQUENCE step 70 that there is no matching sequence, the compression sequence 60 proceeds to an UPDATE NON-MATCHABLE SEQUENCE step 72, wherein the compressing system 4 increments a non-matchable character counter (not shown). The compression sequence 60 then returns to the DETERMINE IF INPUT SEQUENCE IS EXHAUSTED step 66. The compression sequence 60 loops around the steps 66–72 when processing the first non-matchable sequence, "ABCDEF" ($1^{st}$–$6^{th}$ character), of the character sequence 6 until the pointer is advanced to point, in the ADVANCE POINTER step 68, to the $7^{th}$ character "B". At this point, the non-matchable character counter would have been incremented to a value of six because of the number of characters or length of the non-matchable sequence "ABCDEF".

If it is determined in the CHECK FOR MATCHING SEQUENCE step 70 that there is a match between a first sequence of the predetermined minimum number of characters, for example three characters, and a second sequence, the compression sequence 60 will proceed to a FIND LONGEST MATCH step 74. Such will be the case when the sequence "BCD" ($7^{th}$–$9^{th}$ character) is encountered that is matched by another sequence of "BCD" ($2^{nd}$–$4^{th}$ character). In the FIND LONGEST MATCH step 74, the compressing system 4 determines the longest first sequence starting with the character pointed to by the pointer that is matched by a second sequence in the previously processed characters. At this point in the processing of the character sequence 6, the longest first sequence 42 is "BCD" ($7^{th}$–$9^{th}$ characters). The compressing system 4 notes the offset or the number of characters between the start of the two matching sequences 42, 44 and the length or the number of characters in one of these sequences 42, 44. The offset and the length are five and three characters respectively for the matched first sequence "BCD" ($7^{th}$–$9^{th}$ characters).

The compression sequence 60 next proceeds to a CHECK FOR NON-MATCHABLE SEQUENCE step 76, wherein the compressing system 4 determines if there is a non-matchable sequence 46 prior to the current matched first sequence 42. If it is determined in this step 76 that there is a non-matchable sequence 46, the compressing system 4 appends the number of characters or length of the non-matchable sequence 46 to a first buffer (not shown) in the system memory 18 in a FIRST OUTPUT step 78. For the non-matchable sequence "ABCDEF" ($1^{st}$–$6^{th}$ characters), the value six is written to the first buffer according to a coding format that will be described later. Also in the FIRST OUTPUT step 78, the compressing system 4 appends the sequence of non-matchable characters 46 to a second buffer (not shown) in the system memory 18. At this point in the processing of the character sequence 6, the compressing system 4 writes the sequence "ABCDEF" to the second buffer.

If it is determined in the CHECK FOR NON-MATCHABLE SEQUENCE step 76 that there is no non-matchable sequence, the compressing system 4 appends a value zero to the first buffer in a SECOND OUTPUT step 80. From the FIRST OUTPUT step 78 and the SECOND OUTPUT step 80, the compression sequence 60 proceeds to a THIRD OUTPUT step 82, wherein the compressing system 4 appends the offset and the length of the matched first sequence 42 to the first buffer. Both the offset and the length are also coded according to the coding format. In this THIRD OUTPUT step 82, the compressing system 4 also advances the pointer accordingly and clears the non-matchable character counter. Up to this point in the processing of the character sequence 9, the first buffer contains three data items with values of six, five and three respectively. These three data items form a codeword 50.

The compression sequence 60 then returns to the DETERMINE IF INPUT SEQUENCE IS EXHAUSTED step 66 and repeats the above-described steps 68–82 until all the characters in the character sequence 6 have been processed. Specifically, the compression sequence 60 will repeat the steps 66–72 when processing the non-matchable sequence "GHI" ($10^{th}$–$12^{th}$ character). The compression sequence 60 proceeds to the FIND LONGEST MATCH step 74 when processing the sequence "CDG" ($13^{th}$–$15^{th}$ character) in the step 70 because it is matched by another sequence "CDG" ($8^{th}$–$10^{th}$ character). In the FIND LONGEST MATCH step 74, the longest matched sequence is determined to be the sequence "CDGHIC" ($13^{th}$–$18^{th}$ characters). The offset associated with this sequence "CDGHIC" is five and the length of the sequence is six. The compressing system 4 therefore appends another codeword having data items of values three, five and six to the first buffer in the FIRST and THIRD OUTPUT steps 78 and 82. The compressing system 4 also appends the non-matchable sequence "GHI" ($10^{th}$–$12^{th}$ character) prior to the matched sequence "CDGHIC" ($13^{th}$–$18^{th}$ characters) to the second buffer in the SECOND OUTPUT step 78.

Similarly, the remaining sequence "EFBCIJK" ($19^{th}$–$25^{th}$ character) of the character sequence 6 is processed using the compression sequence 60. The processing of the sequence "EFBC" ($19^{th}$–$22^{nd}$ character) results in a third codeword having data items of values zero, fourteen and four to be appended to the first buffer. The first data item of value zero in this third codeword 50 is appended to the first buffer in the SECOND OUTPUT step 80. This zero value data item indicates that there is no non-matchable sequence between the matched sequence "EFBC" ($19^{th}$–$22^{nd}$ character) and the earlier matched sequence "CDGHIC" ($13^{th}$–$18^{th}$ character).

In processing the last three characters "IJK" ($23^{rd}$–$25^{th}$ character), the compression sequence 60 determines, in the step 66, that all the characters in the character sequence 6 have been processed. The compression sequence 60 then proceeds to a FOURTH OUTPUT step 84. In this FOURTH OUTPUT step 84, the compressing system 4 writes the remaining non-matchable sequence "IJK" ($23^{rd}$–$25^{th}$ character) to the second buffer. The compression sequence 20 finally ends in an END step 86, wherein the compressed data or codestream defined by the codewords 50 and the non-matchable sequences 46 is ready for use, such as for transmission via the transfer medium 12 to the decompressing system 10 (FIG. 2). If the codewords 50 and the non-matchable sequences 46 are sent back to back in a single message to the decompressing system 10, the codestream further includes information that indicates the end of the sequence 48 of codewords 50 which happens to be the beginning of the non-matchable sequences 46. This information may be a length of the sequence 48 of codewords that may be coded in a fixed number of bits.

The coding format for the data items in the codewords is next described. Each data item is represented by a predetermined number of bits (m bits) preceded by at least one delimiter bit. The predetermined number of bits may be six bits preceded by a single "1" delimiter bit. The maximum value that is representable with the six bits is $2^6-1=63$. If the value of the data item is less than or equal to sixty-three, the seven bits (one delimiter bit+six bits) are sufficient to represent the value. However if the value exceeds sixty-three, the six bits will represent a remainder of the division of the value by $2^6$. The quotient of the division of the value by $2^6$ is represented by, for example, an equal number of "0" bits, that is recognizably different from the "1" delimiter bit. Each of these "0" bits represents an additional value of sixty-four. The table below shows examples of strings of bits used to represent various values. The value forty-five is represented by 7 bits that includes a delimiter "1" bit (in bold and italicized) and six bits. The value sixty-seven is represented by eight bits which include an additional "0" bit preceding the "1" delimiter bit. Similarly, the value two hundred is represented by ten bits that include three leading "0" bits that represent a total value of one hundred and ninety-two.

| Value of Data Item | Bit String representing the Value | |
|---|---|---|
| 45 | 1101101 | |
| 67 | 01000011 | (64 + 3) |
| 139 | 001001011 | (64 + 64 + 11) |
| 200 | 0001001000 | (64 + 64 + 64 + 8) |

With the above coding format, it takes a minimum of twenty-one bits to represent a codeword. It is thus more economical to write one or two matched characters in the second buffer as a non-matchable sequence than to represent them using such codewords. It is because of this reason that the predetermined minimum number of characters in the CHECK FOR MATCHING SEQUENCE step 70 is selected to be three characters.

Advantageously, the compression method described above does not require all the codewords except the last codeword to be byte aligned. As the codewords are grouped together, it also becomes unnecessary to delimit the codewords from non-matchable sequences of characters.

Although the present invention is described as implemented in the above-described embodiment, it is not to be construed to be limited as such. For example, instead of processing the input sequence byte by byte, the input sequence may be processed using data portions of other lengths.

As another example, a variable number of bits may be used to represent the remainder of the division of the value of a data item by $2^m$ instead of a fixed number, m, of bits. For example, this remainder portion of each of the three data items in each codeword may be represented by different number of bits. The number of remainder bits for each data item in a codeword may be determined during compression. In this case, further information indicating the number of remainder bits used to represent the remainder portions of the data items would have to be included in the output codestream.

I claim:

1. A method for compressing an input sequence of data portions comprising:

sequentially traversing the input sequence portion by portion to determine if a first sequence of portions starting with each portion is matchable with a second sequence of previously traversed portions;

if a first sequence is matchable, noting a length of the first sequence and an offset between the first sequence and a matching second sequence;

recording in sequential order a stream of at least one non-matchable sequence of data portions; and generating an ordered sequence of codewords separate from the stream, wherein each codeword includes three data items denoting a length of a non-matchable sequence preceding a matchable first sequence, the offset associated therewith and the length of the matchable first sequence.

2. A method according to claim 1, further including generating a length of one of the ordered sequence of codewords and the stream of at least one non-matchable sequence of data portions.

3. A method according to claim 1, wherein sequentially traversing the input sequence includes sequentially traversing the input sequence portion by portion to determine if a first longest sequence of portions starting with each portion is matchable with a sequence of previously traversed portions.

4. A method according to claim 1, wherein sequentially traversing the input sequence includes sequentially traversing the input sequence portion by portion to determine if a first longest sequence of portions of at least a predetermined minimum number of portions starting with each portion is matchable with a sequence of previously traversed portions.

5. A method according to claim 1, wherein each data item is of a variable bit length that is non-byte aligned.

6. A method according to claim 5, wherein the codewords are non-byte aligned.

7. A method according to claim 6, wherein the data item is represented by a sequence of bits including:
   m-bits for representing the remainder of the division of a data item by $2^m$;
   at least a delimiter bit preceding the m-bits; and
   if a data item is greater than $2^m-1$, at least one bit different from and preceding the delimiter bit, for representing the quotient of the division of the data item by $2^m$.

8. A method according to claim 7, wherein the at least one bit different from and preceding the delimiter bit includes one or more bits, each of which represents $2^m$ data portions.

9. A method according to claim 6, wherein the data items in each codeword are represented by a sequence of bits including:
   a first, second and third number of remainder bits for representing the remainder of the division of each of the data items respectively by $2^m$, wherein the number of remainder bits is determined during compression of the input sequence;
   at least a delimiter bit preceding each of the first, second and third number of remainder bits; and
   if a data item is greater than $2^m-1$, at least one bit different from and preceding the delimiter bit, for representing the quotient of the division of the data item by $2^m$;
   and wherein the codestream further includes information indicating the first, second and third number of remainder bits in each codeword.

10. A compressing system for compressing an input sequence of data portions comprising:
   means for sequentially traversing the input sequence portion by portion to determine if a first sequence of portions starting with each portion is matchable with a second sequence of previously traversed portions;
   means for noting a length of a matched first sequence and an offset between the first and the second sequences;
   means for recording in sequential order a stream of at least one non-matchable sequence of data portions; and
   means for generating an ordered sequence of codewords separate from the stream, wherein each codeword includes three data items denoting a length of a non-matchable sequence preceding a matchable first sequence, the offset associated with and the length of the matchable first sequence respectively.

11. A compressing system according to claim 10, further including a means for generating a length of one of the ordered sequence of codewords and the stream of at least one non-matchable sequence of data portions.

12. A compressing system according to claim 10, wherein the means for sequentially traversing the input sequence includes a means for sequentially traversing the input sequence portion by portion to determine if a first longest sequence of portions starting with each portion is matchable with a sequence of previously traversed portions.

13. A compressing system according to claim 10, wherein the means for sequentially traversing the input sequence includes a means for sequentially traversing the input sequence portion by portion to determine if a first longest sequence of portions of at least a predetermined minimum number of portions starting with each portion is matchable with a sequence of previously traversed portions.

14. A compressing system according to claim 10, wherein each data item is of a variable bit length that is non-byte aligned.

15. A compressing system according to claim 14, wherein the codewords are non-byte aligned.

16. A compressing system according to claim 15, wherein each data item is represented by a sequence of bits including:
   m bits for representing the remainder of the division of a data item by $2^m$;
   at least a delimiter bit preceding the m bits; and
   if a data item is greater than $2^m-1$, at least one bit different from and preceding the delimiter bit, for representing the quotient of the division of the data item by $2^m$.

17. A compressing system according to claim 16, wherein the at least one bit different from and preceding the delimiter bit includes one or more bits, each of which represents $2^m$ data portions.

18. A compressing system according to claim 15, wherein the data items in each codeword are represented by a sequence of bits including:
   a first, second and third number of remainder bits for representing the remainder of the division of each of the data items respectively by $2^m$, wherein the number of remainder bits is determined during compression of the input sequence;
   at least a delimiter bit preceding each of the first, second and third number of remainder bits; and
   if a data item is greater than $2^m-1$, at least one bit different from and preceding the delimiter bit, for representing the quotient of the division of the data item by $2^m$; and
   wherein the codestream further includes information indicating the first, second and third number of remainder bits in each codeword.

19. A program storage device readable by a computing device, tangibly embodying a program of instructions, executable by the computing device to perform a method for compressing an input sequence of data portions, the method comprising:
   sequentially traversing the input sequence portion by portion to determine if a first sequence of portions starting with each portion is matchable with a second sequence of previously traversed portions;
   if a first sequence is matchable, noting a length of the first sequence and an offset between the first sequence and a matching second sequence;
   recording in sequential order a stream of at least one non-matchable sequence of data portions; and
   generating an ordered sequence of codewords separate from the stream, wherein each codeword includes three data items denoting a length of a non-matchable sequence preceding a matchable first sequence, the offset associated therewith and the length of the matchable first sequence.

20. A program storage device according to claim 19, wherein sequentially sequentially traversing the input sequence includes sequentially traversing the input sequence portion by portion to determine if a first longest sequence of portions starting with each portion is matchable with a sequence of previously traversed portions.

* * * * *